United States Patent
Sugita et al.

(10) Patent No.: US 12,027,380 B2
(45) Date of Patent: Jul. 2, 2024

(54) SEMICONDUCTOR MANUFACTURING APPARATUS AND METHOD OF MANUFACTURING SEMICONDUCTOR DEVICE

(71) Applicant: TOSHIBA MEMORY CORPORATION, Tokyo (JP)

(72) Inventors: Tomohiko Sugita, Yokkaichi (JP); Katsuhiro Sato, Yokkaichi (JP); Hiroaki Ashidate, Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 401 days.

(21) Appl. No.: 17/464,007

(22) Filed: Sep. 1, 2021

(65) Prior Publication Data
US 2021/0398825 A1 Dec. 23, 2021

Related U.S. Application Data

(62) Division of application No. 16/268,538, filed on Feb. 6, 2019, now abandoned.

(30) Foreign Application Priority Data

Jun. 19, 2018 (JP) .................................. 2018-116357

(51) Int. Cl.
*H01L 21/67* (2006.01)
*H01L 21/02* (2006.01)
(Continued)

(52) U.S. Cl.
CPC .. *H01L 21/67017* (2013.01); *H01L 21/02041* (2013.01); *H01L 21/306* (2013.01);
(Continued)

(58) Field of Classification Search
CPC ........... H01L 21/6708; H01L 21/68771; H01L 21/67086; H01L 21/67057; H01L 21/306;
(Continued)

(56) References Cited

U.S. PATENT DOCUMENTS

| | | | |
|---|---|---|---|
| 4,463,904 A | 8/1984 | Bray, Jr. | |
| 4,955,547 A | 9/1990 | Woods | |

(Continued)

FOREIGN PATENT DOCUMENTS

| | | |
|---|---|---|
| CN | 101546695 A | 9/2009 |
| JP | 53-2828 | 1/1978 |

(Continued)

*Primary Examiner* — Keath T Chen
*Assistant Examiner* — Margaret Klunk
(74) *Attorney, Agent, or Firm* — Oblon, McClelland, Maier & Neustadt, L.L.P.

(57) ABSTRACT

In one embodiment, a semiconductor manufacturing apparatus includes a substrate holder configured to hold a plurality of substrates such that the substrates are arranged in parallel to each other. The apparatus further includes a fluid injector including a plurality of openings that inject fluid to areas in which distances from surfaces of the substrates are within distances between centers of the substrates adjacent to each other, the fluid injector being configured to change injection directions of the fluid injected from the openings in planes that are parallel to the surfaces of the substrates by self-oscillation.

11 Claims, 9 Drawing Sheets

(51) Int. Cl.
*H01L 21/306* (2006.01)
*H01L 21/687* (2006.01)

(52) U.S. Cl.
CPC .. *H01L 21/67057* (2013.01); *H01L 21/67086* (2013.01); *H01L 21/68771* (2013.01); *H01L 21/6708* (2013.01)

(58) Field of Classification Search
CPC ......... H01L 21/02041; H01L 21/67017; B05B 1/3405; B05B 1/08; B05B 1/042; B05B 1/046; B05B 1/048; B05B 1/20; B05B 1/202; B05C 5/0291; B05C 5/0283; B05C 5/00; B05C 5/004
See application file for complete search history.

(56) References Cited

U.S. PATENT DOCUMENTS

| | | | | |
|---|---|---|---|---|
| 5,853,624 | A * | 12/1998 | Raghu | F28F 25/06 261/81 |
| 6,199,568 | B1 * | 3/2001 | Arai | H01L 21/67086 134/186 |
| 7,014,131 | B2 | 3/2006 | Berning et al. | |
| 7,111,793 | B2 | 9/2006 | Maruyama et al. | |
| 7,651,036 | B2 * | 1/2010 | Gopalan | B05B 1/08 239/589.1 |
| 7,677,480 | B2 * | 3/2010 | Russell | B05B 1/14 137/833 |
| 8,297,540 | B1 | 10/2012 | Vijay | |
| 2003/0234303 | A1 | 12/2003 | Berning et al. | |
| 2004/0251315 | A1 | 12/2004 | Maruyama et al. | |
| 2007/0163627 | A1 * | 7/2007 | Lim | B05B 1/20 239/553 |
| 2008/0105286 | A1 * | 5/2008 | Kizawa | H01L 21/67051 134/56 R |
| 2009/0239384 | A1 | 9/2009 | Fujiwara | |
| 2016/0338274 | A1 * | 11/2016 | Messner | B05B 1/044 |
| 2017/0087569 | A1 * | 3/2017 | Nagata | B05B 1/20 |

FOREIGN PATENT DOCUMENTS

| | | |
|---|---|---|
| JP | 59-009378 | 3/1984 |
| JP | 63-057641 | 11/1988 |
| JP | 2002-017596 | 1/2002 |
| JP | 2005-533707 | 11/2005 |
| JP | 3854222 | 12/2006 |
| JP | 2008-048877 | 3/2008 |
| JP | 2010-279586 | 12/2010 |
| JP | 2013-137095 | 7/2013 |

* cited by examiner

SEMICONDUCTOR MANUFACTURING APPARATUS AND METHOD OF MANUFACTURING SEMICONDUCTOR DEVICE

CROSS REFERENCE TO RELATED APPLICATION

This application is a Divisional of U.S. application Ser. No. 16/268,538 filed Feb. 6, 2019, which is based upon and claims the benefit of priority from the prior Japanese Patent Application No. 2018-116357, filed on Jun. 19, 2018, the entire contents of each of which are incorporated herein by reference.

FIELD

Embodiments described herein relate to a semiconductor manufacturing apparatus and a method of manufacturing a semiconductor device.

BACKGROUND

When fluid such as liquid and gas is supplied from a nozzle to a wafer, there is a problem that unevenness of supply amounts of the fluid is generated between areas on the wafer. For example, there is a problem that an area exposed to the flow of the fluid and an area unlikely to be exposed to the flow of the fluid are generated on the wafer.

DETAILED DESCRIPTION

Figure 1:
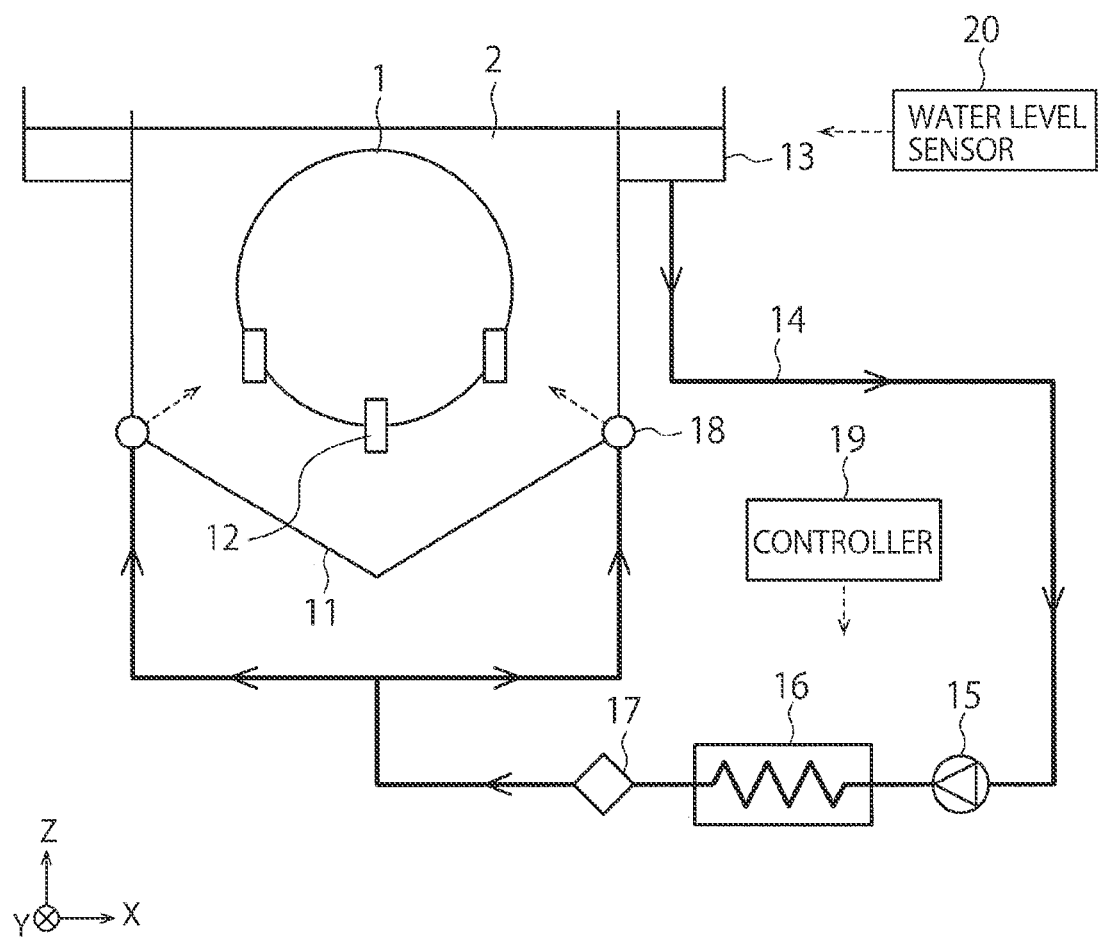
FIG. 1 is a schematic diagram illustrating a configuration of a semiconductor manufacturing apparatus of a first embodiment.

In one embodiment, a semiconductor manufacturing apparatus includes a substrate holder configured to hold a plurality of substrates such that the substrates are arranged in parallel to each other. The apparatus further includes a fluid injector including a plurality of openings that inject fluid to areas in which distances from surfaces of the substrates are within distances between centers of the substrates adjacent to each other, the fluid injector being configured to change injection directions of the fluid injected from the openings in planes that are parallel to the surfaces of the substrates by self-oscillation.

Embodiments will now be explained with reference to the accompanying drawings. In FIGS. 1 to 10C, the same or similar components are denoted by the same reference numerals, and overlapped description will be omitted.

First Embodiment

FIG. 1 is a schematic diagram illustrating a configuration of a semiconductor manufacturing apparatus of a first embodiment. The semiconductor manufacturing apparatus of FIG. 1 is a batch substrate treatment apparatus that treats a plurality of substrates (wafers) 1 with substrate treatment solution 2.

The semiconductor manufacturing apparatus of FIG. 1 includes a substrate treatment tank 11, a substrate holder 12, an overflow module 13, a circulation flow passage 14, a pump 15, a heater 16, a cleaner 17, a plurality of nozzles 18, a controller 19 and a water level sensor 20. The nozzles 18 are examples of a fluid injector.

FIG. 1 illustrates the X direction and the Y direction substantially parallel to an installation surface of the semiconductor manufacturing apparatus and perpendicular to each other, and the Z direction substantially perpendicular to the installation surface of the semiconductor manufacturing apparatus. In this specification, the +Z direction is treated as the upper direction, and the −Z direction is treated as the lower direction. The −Z direction may coincide with the gravity direction, or may not coincide with the gravity direction.

The substrate treatment tank 11 houses the plurality of substrates 1 and the substrate treatment solution 2. These substrates 1 are soaked in the substrate treatment solution 2 inside the substrate treatment tank 11 to be treated by the substrate treatment solution 2, The substrate holder 12 holds these substrates 1 in the substrate treatment tank 11. These substrates 1 are held such that respective surfaces of the substrates 1 (first and second principal planes) become perpendicular to the Y direction, and the substrates 1 are arranged in parallel to each other.

The substrate treatment solution 2 overflown from the substrate treatment tank 11 is stored in the overflow module 13, and is discharged from the overflow module 13 to the circulation flow passage 14. The pump 15, the heater 16, and the cleaner 17 are provided in series with the circulation flow passage 14. The pump 15 carries the substrate treatment solution 2 through the circulation flow passage 14. The heater 16 heats the substrate treatment solution 2 that flows through the circulation flow passage 14. The cleaner 17 cleans the substrate treatment solution 2 that flows through the circulation flow passage 14 by a filter or the like.

The substrate treatment solution 2 that passes through the pump 15, the heater 16, and the cleaner 17 is supplied from the circulation flow passage 14 to the substrate treatment tank 11 through the nozzles 18 again. Thus, the substrate treatment solution 2 circulates between the substrate treatment tank 11 and the circulation flow passage 14. The nozzles 18 inject the substrate treatment solution 2 to gaps between the substrates 1 or to the vicinity of the surfaces of the substrates 1. The nozzles 18 are installed outside the substrate treatment tank 11 in FIG. 1, but may be disposed inside the substrate treatment tank 11 as described below.

The controller 19 controls the operation of the semiconductor manufacturing apparatus. Examples of the controller 19 include a processor, an electric circuit, a PC (Personal Computer). For example, the controller 19 causes the pump 15 to control circulation or a flow rate of the substrate treatment solution 2. The controller 19 controls the operation of the heater 16 to control the temperature of the substrate treatment solution 2. The controller 19 has a function of stopping the operation of the semiconductor manufacturing apparatus on the basis of a water level lowering signal from the water level sensor 20 that monitors the water level of the overflow module 13.

The substrate treatment solution 2 is, for example, solution or liquid chemicals that treat(s) the substrates 1, and is/are more specifically cleaning solution, rinse solution, etchant, or the like. The substrate treatment solution 2 may be replaced with fluid other than the liquid (for example, gas, gas-liquid mixed fluid, supercritical fluid, or solid-liquid mixed fluid). However, in this case, components for liquid (such as the overflow module 13) composing the semiconductor manufacturing apparatus is replaced with components for gas, gas-liquid mixed fluid, supercritical fluid, solid-liquid mixed fluid, or the like.

Figure 2:
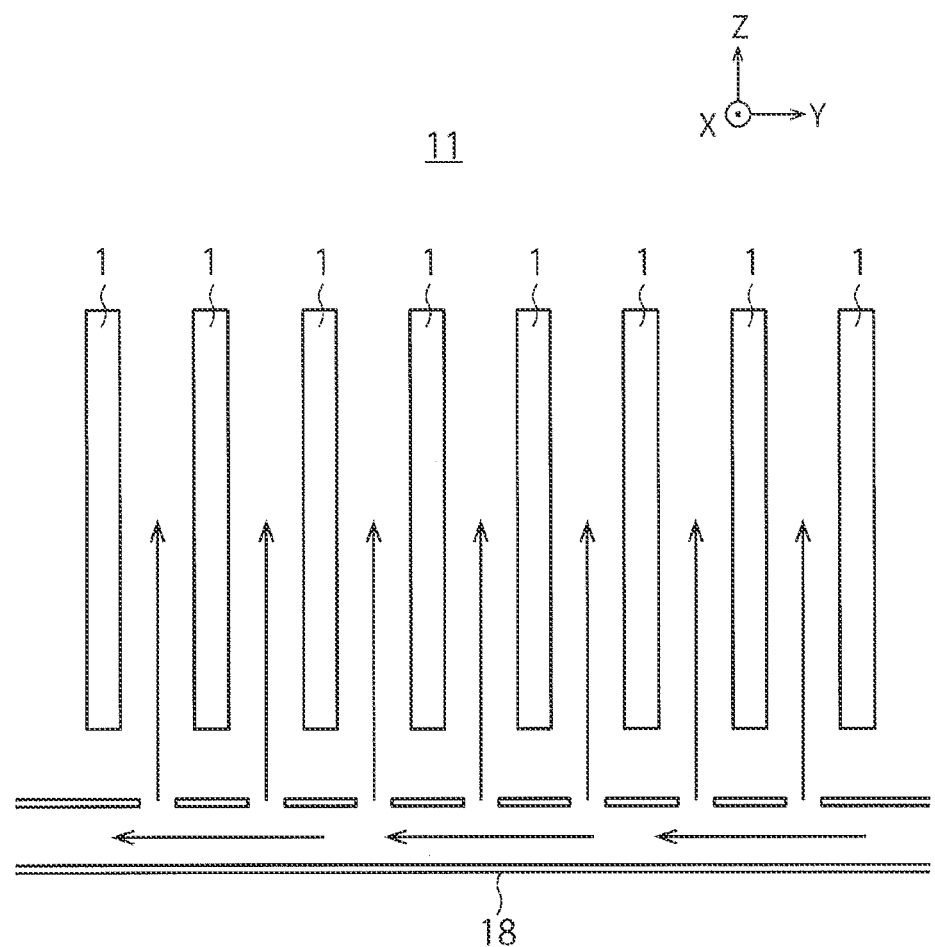
FIG. 2 is a sectional view illustrating a configuration of a substrate treatment tank of the first embodiment.

FIG. 2 is a sectional view illustrating a configuration of a substrate treatment tank 11 of the first embodiment.

FIG. 2 illustrates eight substrates 1 housed in the substrate treatment tank 11, and seven openings provided in the one nozzle 18. These substrates 1 are held so as to be arranged in parallel to each other. Consequently, the seven gaps are provided between the eight substrates 1.

As illustrated by arrows in FIG. 2, the seven openings of the nozzle 18 inject the substrate treatment solution 2 to the seven gaps. More specifically, the openings and the gaps correspond on a one-to-one basis, and each opening injects the substrate treatment solution 2 to only a corresponding gap of these gaps. For example, an opening for a certain substrate injects the substrate treatment solution 2 to an area in which a distance from a surface of the substrate 1 is within a distance between the centers of the substrates 1 adjacent to each other. Consequently, the substrate treatment solution 2 is supplied to the respective surfaces of the substrates 1. The distance between the centers of the substrates 1 adjacent to each other means substantially a distance between the substrates 1 illustrated in FIG. 2.

Each substrate 1 includes a first principal plane formed with a transistor and a memory cell, and a second principal plane on a side opposite to the first principal plane, as surfaces. In this embodiment, the first principal plane is an object to be treated by the substrate treatment solution 2, and the second principal plane is not an object to be treated by the substrate treatment solution 2, Therefore, the substrate treatment solution 2 of this embodiment needs to be injected to at least the respective first principal planes of the substrates 1.

Each of the eight substrates 1 illustrated in FIG. 2 is held such that the first principal plane is directed to the left, and the second principal plane is directed to the right. Therefore, the first principal plane of each substrate 1 faces the second principal plane of the adjacent substrate 1, and the second principal plane of each substrate 1 faces the first principal plane of the substrates 1 adjacent to each other. Therefore, each opening injects the substrate treatment solution 2 to at least the first principal plane of the one corresponding substrate 1. In this case, another opening that allows the substrate treatment solution 2 to be injected to the first principal plane of the leftmost substrate 1 needs to be provided in the nozzle 18. This opening allows the substrate treatment solution 2 to be injected to the area in which a distance from the surface of the substrate 1 is within a distance between the centers of the substrates 1 adjacent to each other.

On the other hand, each of the eight substrates 1 illustrated in FIG. 2 may be held such that the first principal plane faces the first principal plane, and the second principal plane may be held so as to face the second principal plane of the adjacent substrate 1. In this case, each opening allows the substrate treatment solution 2 to be injected to the first principal planes of the two corresponding substrates 1. Therefore, the nozzle 18 in this case only need to include four openings for the eight substrates 1.

Hereinafter, the details of each nozzle 18 of this embodiment will be described. In the following description, the substrate treatment solution 2 is appropriately abbreviated to "liquid 2".

Figure 3A:
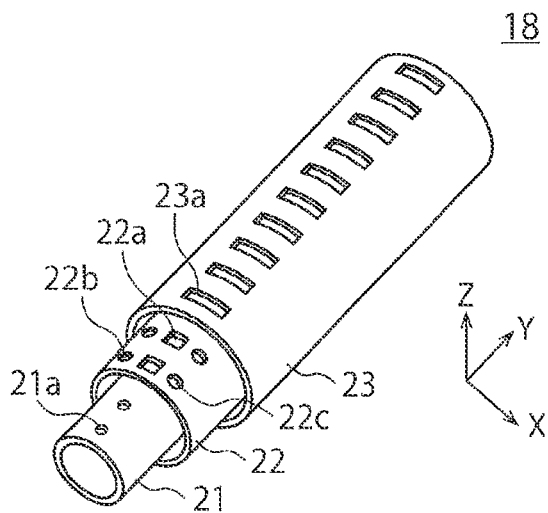
FIGS. 3A to 3C are perspective views and a sectional view illustrating a structure of a nozzle of the first embodiment.
Figure 3B:
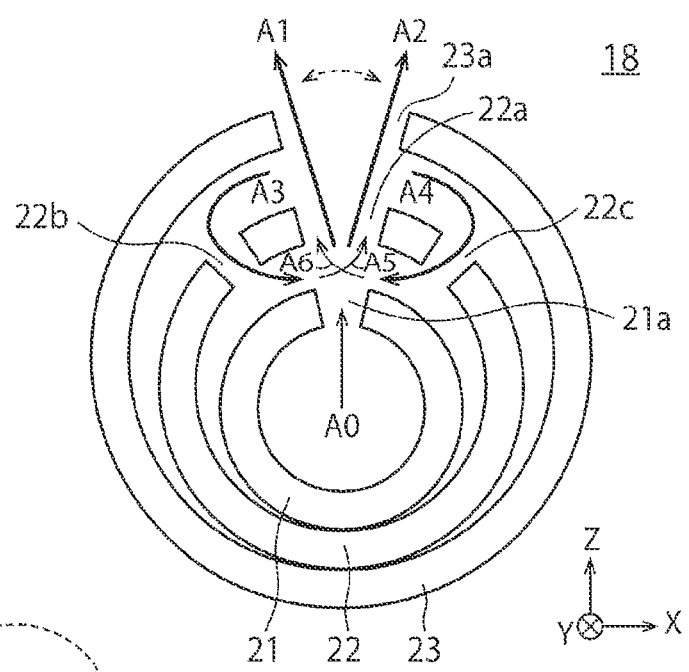
Figure 3C:
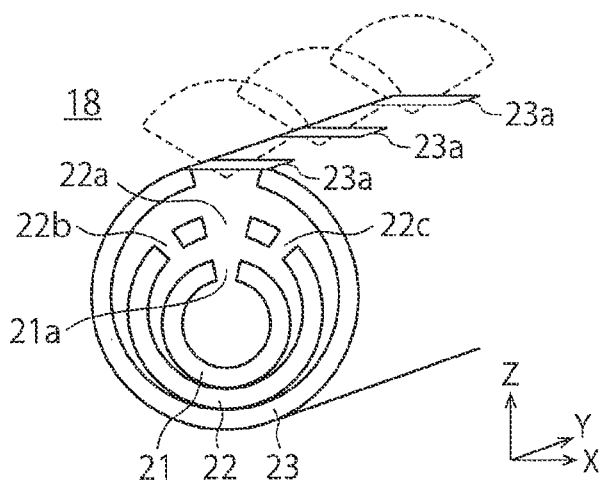

FIGS. 3A to 3C are perspective views and a sectional view illustrating a structure of the nozzle 18 of the first embodiment.

As illustrated in FIG. 3A, the nozzle 18 of this embodiment includes a first pipe 21 having one row of first holes 21a, a second pipe 22 having one row of second holes 22a, and two rows of third holes 22b, 22c, and a third pipe 23 having one row of fourth holes 23a. The second pipe 22 surrounds the first pipe 21, and the third pipe 23 surrounds the second pipe 22. The fourth holes 23a correspond to the openings of the nozzles 18 illustrated in FIG. 2.

These holes are classified in a plurality of sets of holes for each XZ cross-section. FIG. 3B illustrates the one first hole 21a, the one second hole 22a, the two third holes 22b, 22c, and the one fourth hole 23a as a single set of holes. Arrows A0 to A6 denote the flow of the liquid 2 through these holes.

As illustrated in FIG. 3B, the nozzle 18 of this embodiment changes the injection direction of the liquid 2 injected from the fourth hole 23a in a plane in parallel to the surface of each substrate 1 (in an XZ plane) by self-oscillation. FIG. 3B illustrates a state in which the injection direction of the liquid 2 changes between the arrow A1 and the arrow A2 (oscillation of jet). The nozzle 18 of this embodiment does not include any machine or oscillator for exciting this change. The liquid 2 is supplied to the nozzle 18 having the first to fourth holes 21a to 23a, so that this change is self-oscillated, Hereinafter, a process of the self-oscillation of this change will be described.

A space in the nozzle 18 is classified into a first space in the first pipe 21, a second space between the first pipe 21 and the second pipe 22, and a third space between the second pipe 22 and the third pipe 23, The liquid 2 flows through the first space in the first pipe 21, flows from the first pipe into the second space through the first hole 21a, and flows from the second space into the third space through the second hole 22a (arrow A0).

For example, as illustrated by the arrow A1, the liquid 2 that flows in the third space is injected from the third space through the fourth hole 23a. At this time, the liquid 2 illustrated by the arrow A1 flows to the vicinity of left ends of the second hole 22a and the fourth hole 23a, and therefore a part of the liquid 2 is not injected from the fourth hole 23a, and returns from the third space to the second space through the third hole 22b (arrow A3). This liquid 2 flows in the vicinity of right ends of the second hole 22a and the fourth hole 23a by action of flowing force (arrow A5). As a result, this liquid 2 flows as illustrated in the arrow A2.

On the other hand, the liquid 2 that flows in the third space is injected from the third space through the fourth hole 23a as illustrated by the arrow A2, for example. At this time, the liquid 2 illustrated by the arrow A2 flows into the vicinity of the right ends of the second hole 22a and the fourth hole 23a, and therefore a part of the liquid 2 is not injected from the fourth hole 23a, and returns from the third space to the second space through the third hole 22c (arrow A4). This liquid 2 flows into the vicinity of the left ends of the second hole 22a and the fourth hole 23a by action of flowing force (arrow A6). As a result, this liquid 2 flows as illustrated by the arrow A1.

Thus, the flow illustrated by the arrow A1 gradually changes to the flow illustrated by the arrow A2. On the other hand, the flow illustrated by the arrow A2 gradually changes to the flow illustrated by the arrow A1, As a result, the injection direction of the liquid 2 injected from the fourth hole 23a changes between the arrow A1 and the arrow A2. The liquid 2 in the third space is fed back to the second space through the third holes 22b, 22c, so that this change is self-oscillated.

Generally, in a case where liquid is supplied to a substrate from a nozzle, generation of unevenness of supply amounts of the liquid between areas on a substrate becomes a problem. For example, generation of an area exposed to the flow of liquid and an area unlikely to be exposed to the flow of the liquid in a substrate becomes a problem. On the other hand, the nozzle 18 of this embodiment changes the injection direction of the liquid 2 by self-oscillation. Therefore, according to this embodiment, the liquid 2 can be supplied to various areas on the substrate 1, and it is possible to reduce the unevenness of the supply amounts of the liquid 2 between the areas on the substrate 1. This is similar to a case where fluid other than the liquid 2 is injected.

The nozzle 18 of this embodiment periodically changes the injection direction of the liquid 2 in the plane parallel to the surface of the substrate (in the XZ plane). More specifically, the injection direction of the liquid 2 repeatedly changes between the arrow A1 and the arrow A2. The cycle of this periodical change is, for example, 10 seconds or less.

The injection direction of the liquid 2 of this embodiment changes in the plane parallel to the plane parallel to the surface of the substrate (in the XZ plane), but hardly changes in plane perpendicular to the surface of the substrate 1 (in a YZ plane or the like). This state is illustrated in FIG. 3C. In FIG. 3C, all the injection directions of the liquid 2 injected from the three fourth holes 23a change in the XZ planes. In other word, an X component and a Z component of the flow velocity of the liquid 2 in each fourth hole 23a change, but a Y component of the flow velocity of the liquid 2 in each fourth hole 23a does not change. As a result, the liquid 2 from the one fourth hole 23a is injected to only the single gap between the substrates 1, and therefore is not injected to other gaps between the substrates 1 (refer to FIG. 2).

Herein, the plane parallel to the surface of the substrate 1 is referred to as a "parallel plane", and the plane perpendicular to the surface of the substrate 1 is referred to as a "perpendicular plane". As described above, the injection direction of the liquid 2 of this embodiment changes in the parallel plane, but does not change in the perpendicular plane. Therefore, an angle at which the injection direction changes in the parallel plane is larger than an angle at which the injection direction changes in the perpendicular plane. The former angle is roughly an angle between the arrow A1 and the arrow A2 illustrated in FIG. 3B, and, for example, about 10 degrees to about 80 degrees. On the other hand, the latter angle is, for example, a value of 0 degrees or near 0 degrees.

Figure 4A:
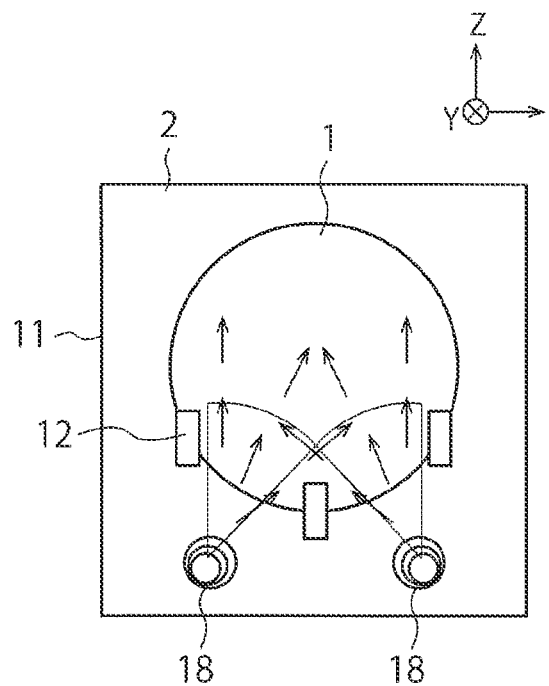
FIGS. 4A and 4B are sectional views for illustrating functions of nozzles of the first embodiment.
Figure 4B:
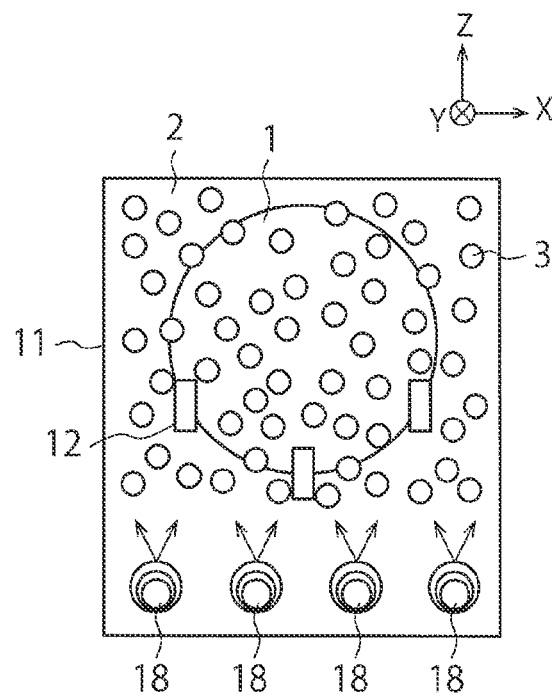

FIGS. 4A and 4B are sectional views for illustrating functions of the nozzles 18 of the first embodiment.

FIG. 4A illustrates the two nozzles 18 that inject the liquid 2, FIG. 4B illustrates the four nozzles 18 that inject the liquid 2 containing bubbles 3. In FIG. 4A, the injection directions of the liquid 2 change, so that the liquid 2 is supplied to various areas on the substrate 1, Similarly, in FIG. 4B, the injection directions of the liquid 2 change, so that the bubbles 3 are supplied to various areas on the substrate 1.

Figure 5A:
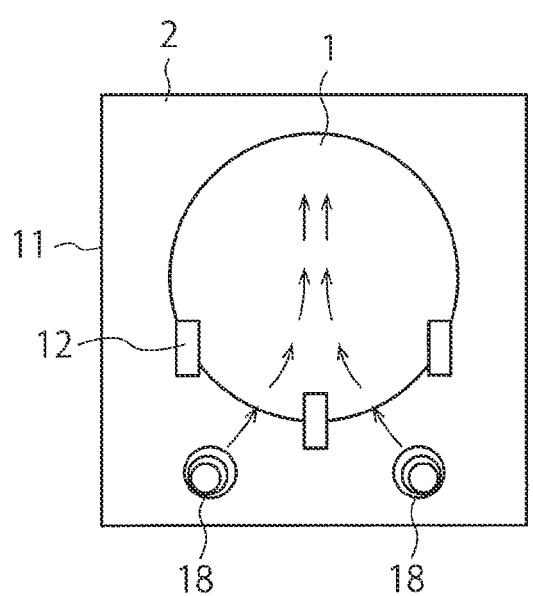
FIGS. 5A and 5B are sectional views for illustrating functions of nozzles of a comparative example of the first embodiment.
Figure 5B:
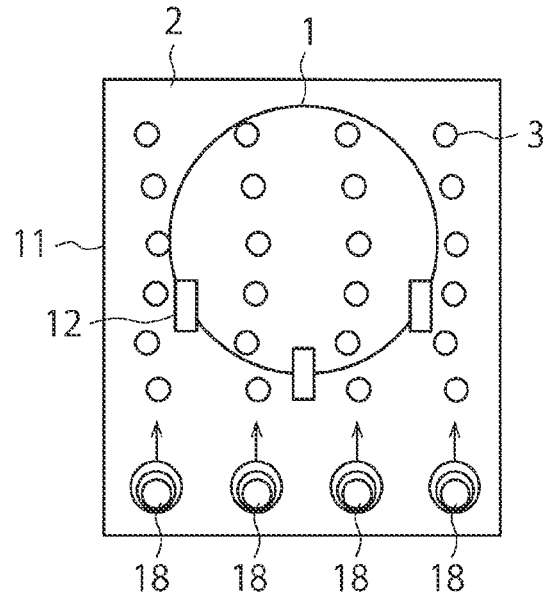

FIGS. 5A and 5B are sectional views for illustrating functions of nozzles of a comparative example of the first embodiment.

FIG. 5A illustrates two nozzles 18 that inject liquid 2, FIG. 5B illustrates the four nozzles 18 that inject the liquid 2 containing bubbles 3. In FIG. 5A, the injection directions of the liquid 2 do not change, and therefore areas exposed to the flow of the liquid 2, and areas unlikely to be exposed to the flow of the liquid 2 are generated in the substrate 1. Similarly, the injection directions of the liquid 2 do not change, and therefore areas exposed to the flow of the bubbles 3, and areas unlikely to be exposed to the bubbles 3 are generated in the substrate 1. These problems can be solved by the change of the injection directions of the liquid 2, as illustrated in FIG. 4A or FIG. 46.

As described above, each nozzle 18 of this embodiment changes the injection direction of the liquid 2 injected from each opening (fourth hole 23a) in the plane parallel to the surface of the substrate by self-oscillation. Therefore, according to this embodiment, it is possible to reduce the unevenness of the supply amounts of the liquid 2 between the areas on the substrate 1.

Treatment of this embodiment is desirably applied to, for example, the substrate 1 for manufacturing a three-dimensional semiconductor memory. The reason is because when the three-dimensional memory is manufactured, a request for in-plane uniformity of a characteristic of the substrate 1 is often strict. This is similar to a second and third embodiments described below.

Second Embodiment

Figure 6A:
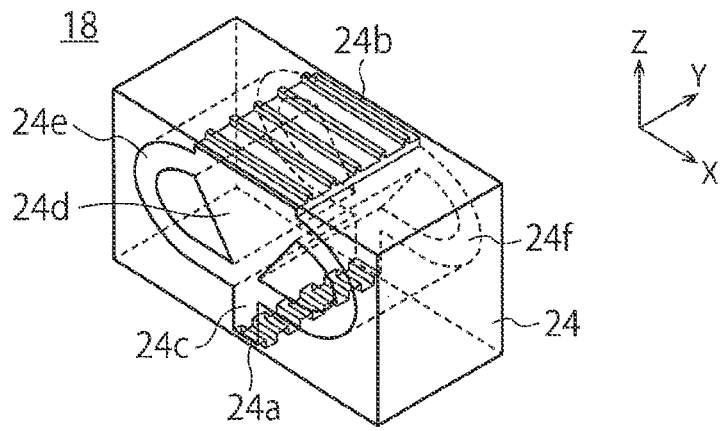
FIGS. 6A to 6C are perspective views and a sectional view illustrating a structure of a nozzle of a second embodiment.
Figure 6B:
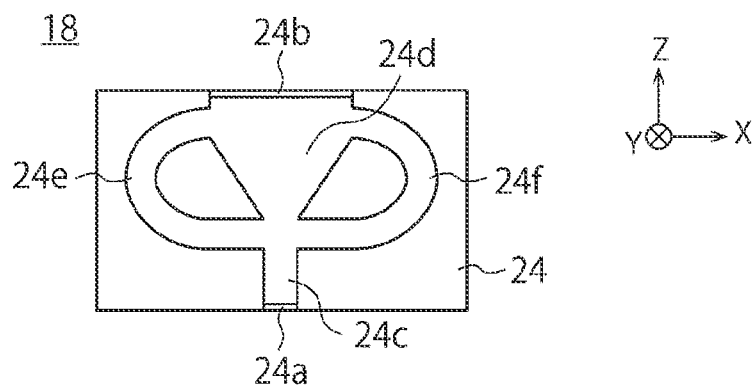
Figure 6C:
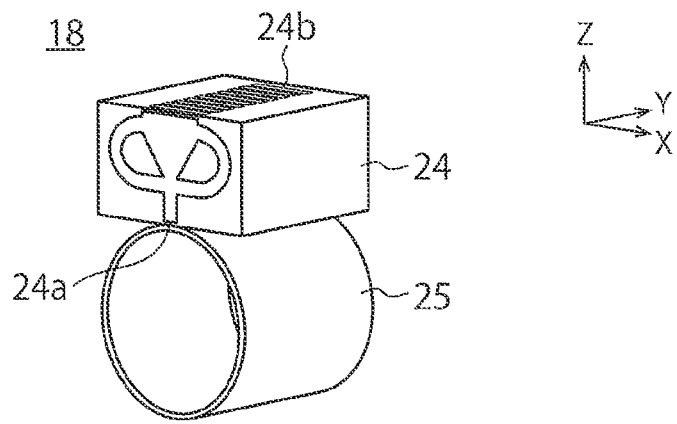

FIGS. 6A to 6C are perspective views and a sectional view illustrating a structure of a nozzle 18 of the second embodiment.

The nozzle 18 of this embodiment includes an injecting member 24 illustrated in FIG. 6A to FIG. 6C, and a pipe 25 illustrated in FIG. 6C. As illustrated in FIG. 6C, the injecting member 24 is mounted on a side surface of the pipe 25. Liquid 2 of this embodiment flows in the pipe 25, flows into the injecting member 24 from the pipe 25, and is injected from the injecting member 24 to respective surfaces of substrates 1.

As illustrated in FIG. 6A, the injecting member 24 includes one row of inlets 24a, one row of outlets 24b, a first injecting flow passage 24c, a second injecting flow passage 24d, a first circulation flow passage 24e, and a second circulation flow passage 24f. The first and second injecting flow passages 24c, 24d each are an example of a first flow passage, and the first and second circulation flow passages 24e, 24f each are an example of a second flow passage. The outlets 24b correspond to the openings of each nozzle 18 illustrated in FIG. 2.

FIG. 6B illustrates an XZ cross-section of the injecting member 24, and illustrates the one inlet 24a and the one outlet 24b located in this XZ cross-section. The first and second injecting flow passages 24c, 24d allows the liquid 2 to transfer from the inlet 24a to the outlet 24b. The width in the X direction of the first injecting flow passage 24c is constant, and the width in the X direction of the second injecting flow passage 24d gradually increases from an upstream side to a downstream side of the liquid 2. The first and second circulation flow passages 24e, 24f allow the liquid 2 in the first and second injecting flow passages 24c, 24d to return from a point on the outlet 24b side to a point on the inlet 24a side. The point on the outlet 24b side is located near the outlet 24b, and the point on the inlet 24a side is located between the first injecting flow passage 24c and the second injecting flow passage 24d. Other XZ cross-sections of the injecting member 24 have structures similar to the XZ cross-section illustrated in FIG. 6B.

Thus, the liquid 2 of this embodiment is fed back from the point on the outlet 24b side to the point on the inlet 24a side, similarly to the first embodiment. Therefore, the injection direction of the liquid 2 injected from each outlet 24b changes in a plane parallel to the surface of the substrate (in the XZ plane) by self-oscillation.

Figure 7:
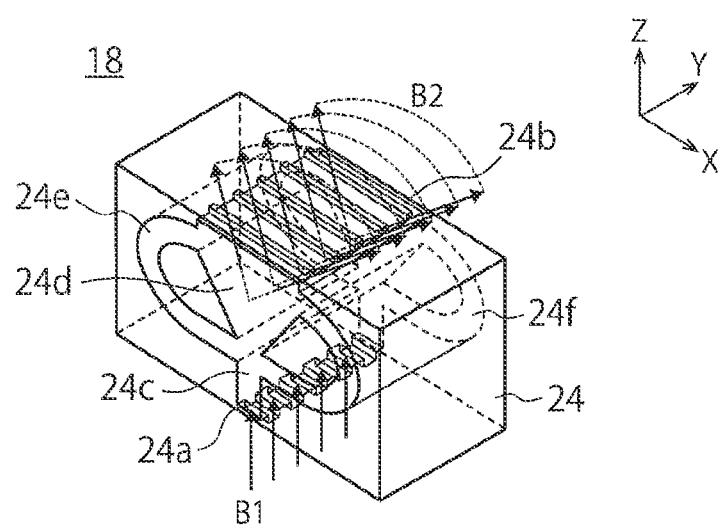
FIG. 7 is a perspective view for illustrating a function of the nozzle of the second embodiment.

FIG. 7 is a perspective view for illustrating a function of the nozzle 18 of the second embodiment.

Arrows B1 denote the inflow directions of the liquid 2 that flows in the inlets 24a from the pipe 25. Arrows B2 denote the injection directions of the liquid 2 injected from the outlets 24b. The injection directions of the liquid 2 of this embodiment change in the plane parallel to the surface of the substrate (in the XZ plane) as illustrated by the arrows 32, but hardly change in a plane perpendicular to the surface of the substrate 1 (in a YZ plane or the like). The cycle of the change is similar to the case of the first embodiment.

Figure 8A:
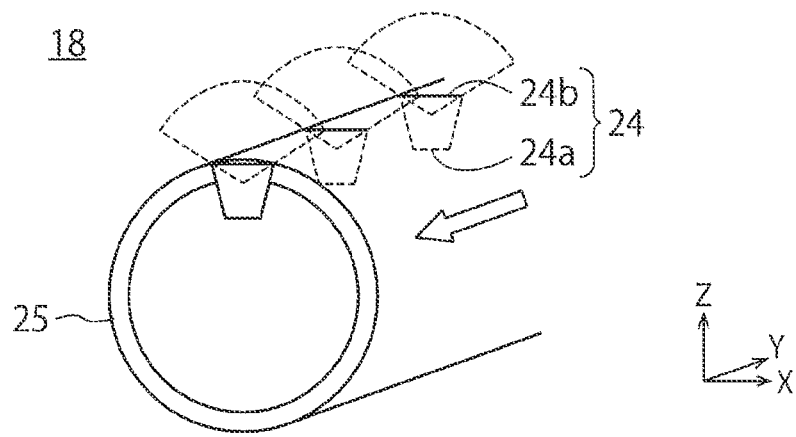
FIGS. 8A and 8B are perspective views illustrating structures of nozzles of modifications of the second embodiment.
Figure 8B:
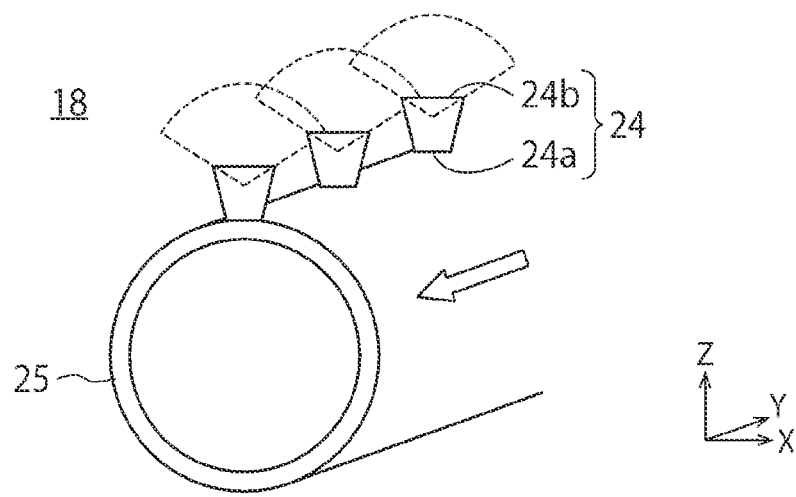

FIGS. 8A and 8B are perspective views illustrating structures of nozzles 18 of modifications of the second embodiment.

FIG. 8A and FIG. 83 each omit illustration of a whole of the injecting member 24 for the purpose of illustrative clarity, and illustrate only the inlets 24a and the outlets 24b of the injecting member 24. In FIG. 8A, the injecting member 24 are disposed inside the pipe 25, and the outlets 24b are located in the side surface of the pipe 25. In FIG. 8B, the injecting member 24 is disposed outside the pipe 25, and the inlets 24a are located in the side surface of the pipe 25.

The nozzle 18 of this embodiment may employ either configuration of FIG. 8A and FIG. 83, The configuration of FIG. 8A has an advantage capable of downsizing the nozzle 18, for example. On the other hand, the configuration of FIG. 8B has an advantage that detachable attachment of the injecting member 24 to the pipe 25 is easy, for example. In this embodiment, the only one injecting member 24 may be mounted on the one pipe 25, or a plurality of the injecting members 24 may be mounted on the one pipe 25.

Figure 9:
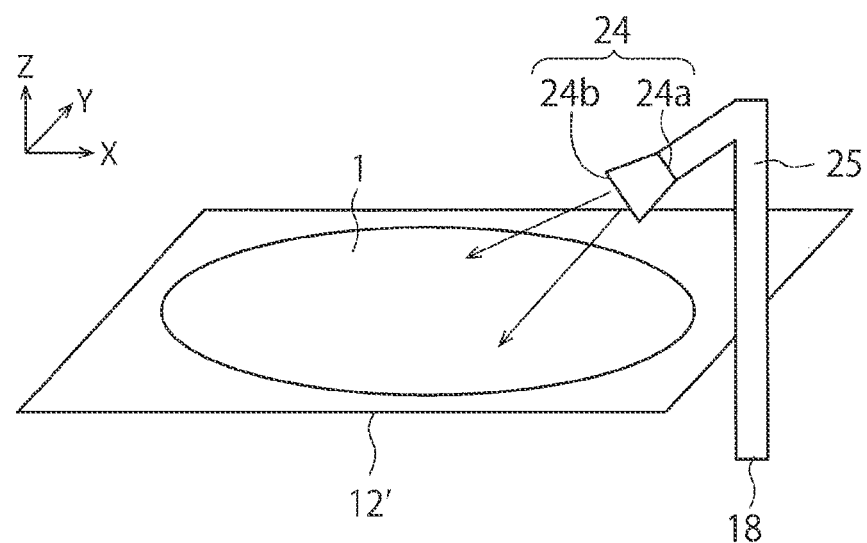
FIG. 9 is a perspective view illustrating a nozzle of a modification of the second embodiment.

FIG. 9 is a perspective view illustrating a structure of a nozzle 18 of a modification of the second embodiment.

In this modification, a semiconductor manufacturing apparatus of FIG. 1 is a single wafer processing (single substrate processing) substrate treatment apparatus that treats a single substrate 1 by substrate treatment solution 2. The above substrate holder 12 is replaced with a substrate holder 12' that horizontally holds the single substrate 1. An example of the substrate holder 12' is a stage on which the substrates 1 is placed.

The nozzle 18 of this modification includes a pipe 25, and an injecting member 24 mounted on a tip of the pipe 25. The injecting member 24 has the structure illustrated in FIG. 6A. However, the number of inlets 24a of the injecting member 24 may be one or the plural number. Similarly, the number of outlets 24b of the injecting member 24 may be one or the plural number.

The nozzle 18 of this modification injects liquid 2 to a substrates 1. At this time, the injection directions of the liquid 2 injected from the outlets 24b changes in a plane parallel to a surface of substrate 1 (in an XY plane) by self-oscillation.

As described above, the nozzle 18 of this embodiment changes the injection direction of the liquid 2 injected from each opening (outlet 24b) in the plane parallel to the surface of the substrate 1 by self-oscillation. Therefore, according to this embodiment, unevenness of supply amounts of the liquid 2 between areas on the substrates 1 can be reduced similarly to the first embodiment.

Third Embodiment

Figure 10A:
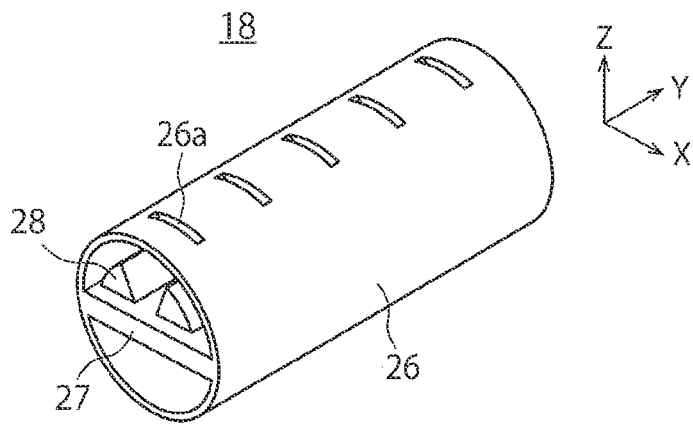
FIGS. 10A to 10C are a sectional view and perspective views illustrating a structure of a nozzle of a third embodiment.
Figure 10B:
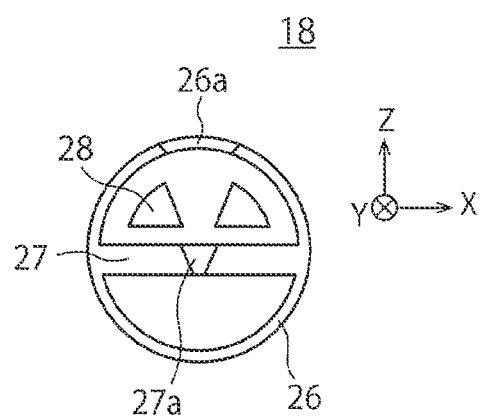
Figure 10C:
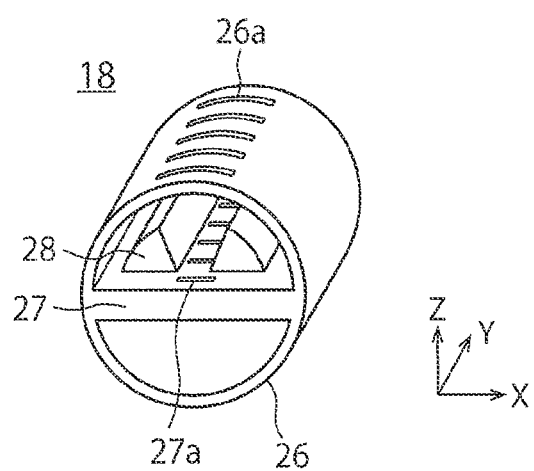

FIGS. 10A to 10C are perspective views and a sectional view illustrating a structure of a nozzle 18 of a third embodiment.

The nozzle 18 of this embodiment includes one pipe 26 having a tubular shape, one first member 27 having a plate shape, and two second members 28 having a rod shape, as illustrated in FIG. 10A to FIG. 10C.

As illustrated in FIG. 10A, a space in the pipe 26 is partitioned into a lower space that functions as a first flow passage which allows liquid 2 to be transferred, and an upper space that functions as a second flow passage into which the liquid 2 flows from the first flow passage. The first flow passage and the second flow passage are partitioned by the first member 27 provided in the pipe 26. On the other hand, the two second members 28 are provided in parallel to each other in the second flow passage.

As illustrated in FIG. 10C, the pipe 26 includes one row of first holes 26a, and the first member 27 includes one row of second holes 27a. The first holes 26a are provided on the second flow passage side of the pipe 26, and correspond to the openings of the nozzle 18 illustrated in FIG. 2.

FIG. 10B illustrates an XZ cross-section of the nozzle 18, and illustrates the one first hole 26a and the one second hole 27a located in this XZ cross-section. The liquid 2 in the first flow passage flows into the second flow passage through the second hole 27a. The two second members 28 form a flow passage that allows this liquid 2 to return from a point on the first hole 26a side to a point on the second hole 27a side. The point on the first hole 26a side is located near the first hole 26a, and the point on the second hole 27a side is located near the second hole 27a. Other XZ cross-sections of the nozzle 18 of this embodiment have structures similar to the XZ cross-section illustrated in FIG. 10B.

Thus, the liquid 2 of this embodiment is fed back from the point on the first hole 26a side to the point on the second hole 27a side, similarly to the first and second embodiments. Therefore, the injection direction of the liquid 2 injected from each first hole 26a changes in a plane parallel to the surface of the substrate 1 (in the XZ plane) by self-oscillation. The function of the nozzle 18 of this embodiment is similar to the function of the nozzle 18 of the second embodiment described with reference to FIG. 7.

As described above, the nozzle 18 of this embodiment changes the injection direction of the liquid 2 injected from each opening (first hole 26a) in the plane parallel to the surface of the substrate 1 by self-oscillation. Therefore, according to this embodiment, unevenness of supply amounts of the liquid 2 between areas on the substrates 1 can be reduced similarly to the first and second embodiments.

While certain embodiments have been described, these embodiments have been presented by way of example only, and are not intended to limit the scope of the inventions.

Indeed, the novel apparatuses and methods described herein may be embodied in a variety of other forms; furthermore, various omissions, substitutions and changes in the form of the apparatuses and methods described herein may be made without departing from the spirit of the inventions. The accompanying claims and their equivalents are intended to cover such forms or modifications as would fall within the scope and spirit of the inventions.

The invention claimed is:

1. A semiconductor manufacturing apparatus comprising:
a substrate holder configured to hold a plurality of substrates such that the substrates are arranged in parallel to each other; and
a fluid injector including a plurality of openings that inject fluid to areas in which distances from surfaces of the substrates are within distances between centers of the substrates adjacent to each other, the fluid injector being configured to change injection directions of the fluid, injected from each opening of the plurality of openings, in planes that are parallel to the surfaces of the substrates by self-oscillation,
the fluid injector includes a first pipe that includes a first hole, a second pipe that surrounds the first pipe and that includes a second hole and a third hole, and a third pipe that surrounds the second pipe and that includes a fourth hole corresponding to one opening of the plurality of openings,
the fluid flows from a first space in the first pipe into a second space between the first pipe and the second pipe through the first hole, flows from the second space into a third space between the second pipe and the third pipe through the second hole, returns from the third space to the second space through the third hole, and is injected from the third space through the fourth hole.

2. The apparatus of claim 1, wherein
the substrate holder holds N substrates such that (N-1) gaps are provided between the N substrates where N is an integer of three or more,
each opening of the plurality of openings of the fluid injector injects the fluid to only one corresponding gap of the N-1 gaps, and
the fluid injector periodically changes the injection directions of the fluid in the planes that are parallel to the surfaces of the substrates.

3. The apparatus of claim 1, wherein the second pipe includes, as the third hole, a pair of holes provided to sandwich the second hole.

4. The apparatus of claim 1, wherein the fluid injector periodically changes the injection directions of the fluid in the planes that are parallel to the surfaces of the substrates.

5. The apparatus of claim 4, wherein a cycle of the periodical change is 10 seconds or less.

6. The apparatus of claim 1, wherein
openings of the plurality of openings are provided to be spaced from each other in a direction that is perpendicular to the surfaces of the substrates,
the fluid injector selectively changes the injection directions of the fluids, injected from each opening of the plurality of openings, by the self-oscillation, and
areas through which the fluid injected from each opening of the plurality of openings passes by the self-oscillation include a part or all of the areas in which the distances from the surfaces of the nearest substrates from the respective openings are within the distances between the centers of the substrates adjacent each other.

7. The apparatus of claim 1, wherein
the fluid injector is provided under the substrates,
openings of the plurality of openings are provided upward or inclined upward on upper portions of the fluid injector, and
the injection directions of the fluid are directions in which the fluid rises in a tank configured to house the substrates and the fluid.

8. The apparatus of claim 1, wherein the fluid injector is capable of injecting liquid and bubbles as the fluid, and configured to change the injection directions of the fluid, injected from each opening of the plurality of openings, by the self-oscillation, to reduce unevenness of supply amounts of the fluid between areas on a substrate.

9. A semiconductor manufacturing apparatus comprising:
a substrate holder holding a single substrate; and
a fluid injector including a plurality of openings that inject fluid to a surface of the substrate, the fluid injector being configured to change injection directions of the fluid, injected from each opening of the plurality of openings, in planes that are parallel to the surface of the substrate by self-oscillation,
the fluid injector includes a first pipe that includes a first hole, a second pipe that surrounds the first pipe and that includes a second hole and a third hole, and a third pipe that surrounds the second pipe and that includes a fourth hole corresponding to one opening of the plurality of openings, and
the fluid flows from a first space in the first pipe into a second space between the first pipe and the second pipe through the first hole, flows from the second space into a third space between the second pipe and the third pipe through the second hole, returns from the third space to the second space through the third hole, and is injected from the third space through the fourth hole.

10. The apparatus of claim 9, wherein
openings of the plurality of openings are provided to be spaced from each other in a direction that is perpendicular to the surface of the substrate, and the fluid injector selectively changes the injection directions of the fluid, injected from each opening of the plurality of openings, by the self-oscillation.

11. The apparatus of claim 9, wherein the fluid injector is configured to change the injection directions of the fluid, injected from each opening of the plurality of openings, by the self-oscillation, to reduce unevenness of supply amounts of the fluid between areas on the substrate.

* * * * *